United States Patent [19]

Shirato

[11] Patent Number: 4,500,975
[45] Date of Patent: Feb. 19, 1985

[54] MASK ROM-TYPE SEMICONDUCTOR MEMORY DEVICE

[75] Inventor: Takehide Shirato, Hiratsuka, Japan

[73] Assignee: Fujitsu Limited, Kawasaki, Japan

[21] Appl. No.: 331,478

[22] Filed: Dec. 16, 1981

[30] Foreign Application Priority Data

Dec. 26, 1980 [JP] Japan .................. 55-186886

[51] Int. Cl.³ .......................... G11C 11/40
[52] U.S. Cl. .................................. 365/104
[58] Field of Search .................... 365/94–96, 365/103–104; 307/238.5, 238.1, 238.8

[56] References Cited

U.S. PATENT DOCUMENTS 4,074,238 2/1978 Masuda .
4,081,794 3/1978 Parks et al. ............. 365/103 X

FOREIGN PATENT DOCUMENTS 2348659 4/1975 Fed. Rep. of Germany ...... 365/103
2175960 10/1973 France .
1375355 11/1974 United Kingdom .

OTHER PUBLICATIONS

IBM Technical Disclosure Bulletin, "FET Array Personalization by Ion Implantation" by R. W. Knepper, vol. 15, No. 9, Feb. 1973, pp. 2919–2920.
IBM Technical Disclosure Bulletin, "Self-aligned Polysilicon Gate MOSFETS with Tailored Source and Drain Profiles", Bassous et al., vol. 22, No. 11, 4/1980.

Primary Examiner—Robert L. Richardson
Attorney, Agent, or Firm—Staas & Halsey

[57] ABSTRACT

A plurality of MIS-type transistors are arranged in a matrix, with each one of these MIS-type transistors corresponding to one memory information bit. These MIS-type transistors are formed so as to store and read binary information in accordance with whether the characteristic of these MIS-type transistors is normally on or normally off. At least one of the source and drain regions of the MIS-type transistors having a normally on characteristic is formed with a higher impurity density or at a greater depth compared with the regions of the MIS-type transistors having a normally off characteristic.

5 Claims, 11 Drawing Figures

MASK ROM-TYPE SEMICONDUCTOR MEMORY DEVICE

FIELD OF THE INVENTION

The present invention relates to a read-only semiconductor memory device (ROM), especially to a ROM construction using a single custom-made mask to write the information during the manufacturing process (hereinafter, "mask ROM"), and the method for manufacturing the same.

BACKGROUND OF THE INVENTION

Mask ROM's have information written into them during the manufacturing process. They are suited for cases where a large volume of ROM's with the identical memory content are used. Mask ROM's are consequently used in systems such as control memories in microprogram-control-type computers, microcomputer program memories, and for various kinds of terminals.

Conventional mask ROM's may be classified into two types. The first type is where the "0" or "1" information to be written is distinguished by the presence or absence, of electrode contact holes, the pattern of which is formed by a custom-made photomask. More specifically, the transistors are arranged in a matrix, and electric contact holes are selectively formed in the transistor drain regions. Application of an input signal to the gate of the transistors results in either a high or low potential level output of each transistor, depending on whether or not the each drain region is connected to the electric source via an electrode contact hole. The different outputs enable determination of whether the information stored in each transistor is "0" or "1".

The first type of mask ROM is manufactured by the following process. Many enhancement type metal-insulator semiconductor (MIS) (typically, metal-oxide semiconductor (MOS)) transistors are arranged on a semiconductor substrate to form memory cells. The substrate is then covered by an insulation layer. A program photomask is used to selectively form electrode contact holes in the insulation layer at the drain regions of the memory cell transistors based on the desired information content. Subsequent completion of the mask ROM requires only the formation of a surface protective layer on which wiring is formed and the formation of bonding pad.

This manufacturing process is advantageous in that the processing from the master slice device to the completed mask ROM is very short. At the same time, however, the process is disadvantageous because the necessity of providing drain regions for the formation of electrode contact windows for each memory cell MOS transistor reduces integration density.

In the second type of mask ROM, the "0" or "1" information to be written is distinguished by whether the transistor is an enhancement type or depletion type. More specifically, a plurality of memory cell MOS transistors are connected in series. A high level input signal is supplied to the gate of the nonselected MOS transistors and a low level input signal to the gate of the selected MOS transistors. This places selected MOS transistors of the enhancement type in the off state, and produces a high output level at the source terminal of the series-connected MOS transistors. At the same time, this places selected MOS transistors of the depletion type in the on state and produces a low output level at the source terminal of the series-connected MOS transistors. In other words, the memory matrix is formed as a NAND gate circuit.

The second type of mask ROM is manufactured by the following process. When the MOS transistors are formed on the semiconductor substrate, a programmed mask is used to create impurity introduction layers only on the regions forming the MOS transistors. MOS transistors are then formed into either depletion types of enhancement types in accordance with the desired memory information.

With the second type of mask ROM, it is not necessary to provide electrode contact windows for each MOS transistor, therefore enabling higher integration density than the first type. However, this second type of mask ROM requires many processing steps from the programming process to the completed mask ROM, such as the formation of the gate electrodes and output wiring, formation of the source-drain region, formation of the electrode contact windows, formation of the metallic wiring layer, formation of the surface protective layer, and formation of bonding pads.

OBJECTS AND SUMMARY OF THE INVENTION

An object of the present invention is to provide a novel ROM semiconductor device (mask ROM), for which information is written during the manufacturing process, and the method of manufacturing the same.

Another object of the present invention is to provide a mask ROM offering higher integration density, and the method for manufacturing the same.

A further object of the present invention is to provide a mask ROM which can be completed in a very short time after the programming process, and the method for manufacturing the same.

The above-mentioned objects can be achieved by a ROM semiconductor device in which a plurality of MIS transistors are arranged in a matrix, each of the transistors corresponding to one memory information bit, and binary information is stored in accordance with whether each of said MIS transistors is of a normally on characteristic or normally off characteristic; the characteristic feature of the present invention is that one or both of the source regions and drain regions of the MIS transistors of the normally on characteristic is formed deeper than the source regions and drain regions of the MIS transistors of the normally off characteristic. The MIS transistors of the normally on characteristic may typically be punch-through type MIS transistors, and the MIS transistors of the normally off characteristic may be the usual enhancement-type MIS transistors.

Further, in the method for manufacturing the mask ROM, the source-drain regions and the gate electrodes for the memory cell MIS transistors are formed in or on the semiconductor substrate, by the method comprising the following steps. When the desired information is written into the memory cell, ion implantation is selectively carried out on the regions where the normally on MIS transistors will be formed, so as to selectively increase the impurity density in the source-drain regions of the MIS transistors and therefore increase the depth of formation of the source-drain regions.

Still further, in the method for manufacturing the mask ROM, the source-drain regions and the gate electrodes for the memory cell MIS type transistors are formed in or on the semiconductor substrate by the method comprising the following steps. When the desired information is written into the memory cell, a high energy beam is selectively directed to the regions where the normally on MIS transistors will be formed, so as to create local heat and form impurity diffused source-drain regions of the transistors and therefore, increase the depth of formation of the source-drain regions.

Further features and advantages of the present invention will be apparent from the ensuing description with reference to the accompanying drawings, to which, however, the scope of the invention is in no way limited.

DETAILED EXPLANATION OF INVENTION

Figure 1:
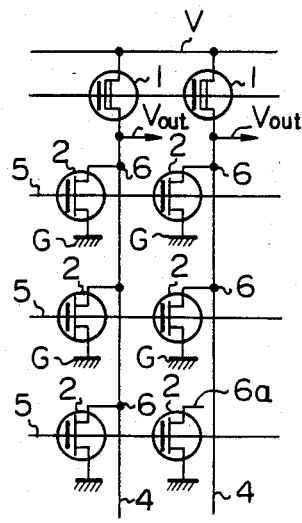
FIG. 1 and FIG. 2 illustrate circuits of conventional semiconductor mask ROM memory devices.

FIG. 1 illustrates a circuit of a conventional mask ROM in which the binary information to be written is distinguished by the presence or absence of electrode contact holes. FIG. 1 illustrates an example of an n channel-type device. In FIG. 1, depletion-type MOS transistors 1 are connected between an electric source voltage $V_{DD}$ and bit lines 4 as load transistors. Enhancement-type MOS field-effect transistors 2 are used for memory cells, and are connected at the gate to word lines 5 and grounded at the source. In FIG. 1, it should be noted that the drains of the transistors 2 are connected to the bit lines 4 when the drains have electrode contacts, and are not connected when they do not. In FIG. 1, reference number 6a identifies a drain having no electrode contact. The circuit shown in FIG. 1 forms a NOR-type circuit. That is, in FIG. 1, when a high input level signal is applied to a selected word line 5 and a drain having an electrode contact is connected to the bit line 4, a current flows through the transistor connected to the word line to place the output $V_{out}$ of the bit line at a low level. However, when the drain has no electrode contact and is not connected to the bit line, no current flows in the bit line through the transistor, therefore leaving the output $V_{out}$ of the bit line at a high level. This allows the differentiation of the binary information in the transistors 2. As mentioned previously, this method does not allow high integration density, because regions for forming electrode contact windows must be provided for each memory cell MOS transistor.

Figure 2:
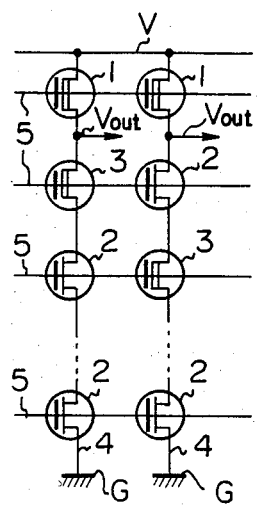

FIG. 2 illustrates a circuit of a conventional mask ROM in which the binary information to be written is distinguished by the formation of the MOS field-effect transistors as enhancement types or depletion types. FIG. 2 also illustrates an example of an n channel type ROM device. In FIG. 2, depletion-type MOS transistors 1 are connected to the electric source voltage $V_{DD}$ as load transistors as in FIG. 1. A plurality of MOS transistors are connected in series with the load transistors 1 and are formed as enhancement-type transistors 2 or depletion-type transistors 3 in accordance with whether the information to be stored is "0" or "1". The circuit shown in FIG. 2 forms a NAND-type circuit. In FIG. 2, the gates of each transistor 2 and 3 are connected to word lines 5, and the series-connected sources and drains of the transistors 2 and 3 form the bit lines 4.

In the circuit shown in FIG. 2, during the readout operation, a high level input signal is supplied nonselectively to each word line to place the MOS transistors for nonselected memory cells in the on state regardless of whether the MOS transistors are of the enhancement type or depletion type. Application of a low level input signal to the word line to be selected places MOS transistors which are connected to this word line, and which are enhancement types, into a nonconductive state and cuts off the source and the drain of those MOS transistors, placing the output $V_{out}$ at the high level. When the MOS transistors are depletion types, the output $V_{out}$ remains at the low level. This allows the differentiation of the information stored in the transistors 2 and 3. In this type of mask ROM, the establishment in the programming process of enhancement characteristics or depletion characteristics for each MOS transistor memory cell must be followed by many processes, including a gate-forming process, before the mask ROM is completed, as mentioned previously.

Figure 3:
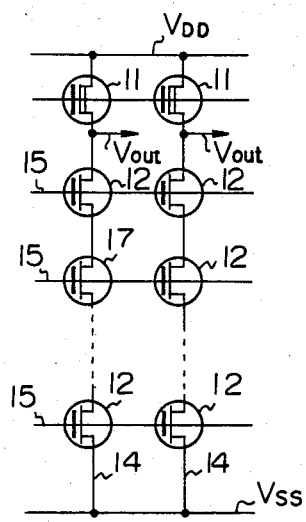
FIG. 3 illustrates a circuit of a first embodiment of a semiconductor mask ROM memory device of the present invention.
Figure 4A:
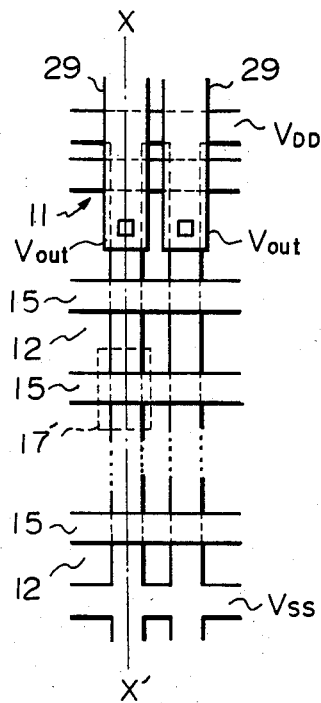
FIGS. 4A and 4B are a plan view and a sectional view of the embodiment of the semiconductor memory device of FIG. 3, respectively.

FIG. 3 illustrates a circuit of a semiconductor ROM memory device based on the present invention, and FIG. 4A is a plan view of the device shown in FIG. 3.

As shown in FIG. 3 and FIG. 4A, the memory cell array in a semiconductor ROM memory device based on the present invention is similar to the conventional memory cell array shown in FIG. 2. That is, depletion-type MIS transistors are connected to a drain electric source voltage $V_{DD}$ as load transistors. A plurality of MIS transistors 12 of a normally off characteristic (typically enhancement-type MOS transistors) and MIS transistors 17 of a normally on characteristic are connected in series, so as to form a plurality of bit lines 14. One end of the bit lines 14 is connected to the source line $V_{SS}$ grounded as shown in FIG. 3. The gates of the MIS transistors are formed in the same positions in each bit line 14 and are connected to the word lines 15, which are arranged at right angles to the bit lines 14. This arrangement forms a memory cell matrix. The output wires $V_{out}$ are connected the load transistors 11 of each bit line 14 and to the memory cell transistor sequences. The memory cell MIS transistors where information, for example "1", in each bit line 14 is written is formed with a normally-on-type transistor, especially, a punch-through-type MIS transistor. Here, the "punch-through-type MIS transistor" means an MIS transistor where the current flows between the source and the drain when the voltage is applied between them if no voltage is applied to the gate, because of the short distance between the source and the drain in the already known MIS technique.

To read out the information written in the semiconductor memory device, high voltage is applied to the nonselected word lines in the memory device and a low voltage is applied to the selected word lines. When the memory cell of the bit line connected to the selected word line is formed by a normally-on-type MIS transistor corresponding to "1" information, such as a punch-through-type transistor, all transistors connected to the bit line are placed in the on state, with the result that the output $V_{out}$ of the bit line is placed at the low voltage level. However, if the memory cell of the bit line connected to the selected word line is formed by a normally-off-type MIS transistor, such as an enhancement-type transistor, the enhancement transistor connected to the bit line is placed in the off state, with the result that the output $V_{out}$ of the bit line is placed at a high voltage level nearly equal to voltage $V_{DD}$. This allows the stored information to be read out by the output level of each bit line.

FIG. 5A through FIG. 5E are cross-sections explaining the method of the first embodiment of the manufacture of the semiconductor memory device shown in FIG. 3. FIG. 6 is a cross-section explaining the method of the second embodiment of the manufacture of the same.

Figure 5A:
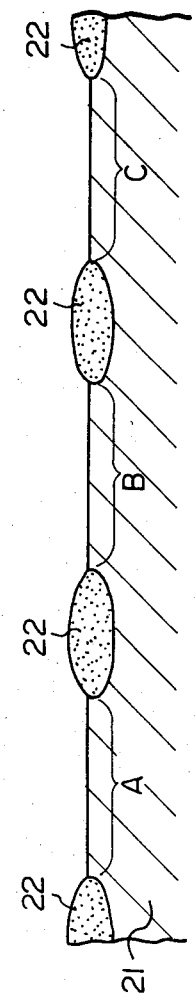
FIGS. 5A through 5E are sectional views at sequential stages of the processing of the first embodiment of the manufacture of a semiconductor mask ROM memory device of the present invention.

With reference to FIG. 5A through FIG. 5E, the first embodiment of the manufacture of an n channel-type semiconductor ROM memory device, will now be described. First, a field oxide silicate ($SiO_2$) layer 22 is formed on the P-type silicon substrate 21 so as to separate the transistor elements. In FIG. 5A, A illustrates the region where the depletion-type transistor element for the load transistor will be formed; B the region where the enhancement-type transistor element will be formed; and C the region where the punch-through-type transistor will be formed. The information to be written determines whether a punch-through-type or enhancement-type transistor is formed. Therefore, which region will have the punch-through-type transistor is unknown at this stage. For the purpose of discussion only, we assume that the punch-through-type transistor will be formed on region C. In FIG. 5A, the memory cell transistors are individually surrounded by field oxide film. In an actual series connection of the memory cell transistors, however, adjacent transistors are not separated by field oxide film but are connected by an n-type region commonly used for the source and the drain.

Figure 5B:
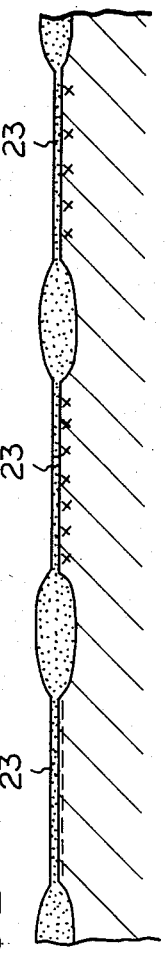
Figure 5C:
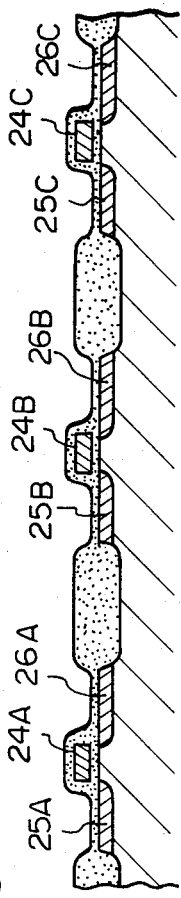
Figure 6:
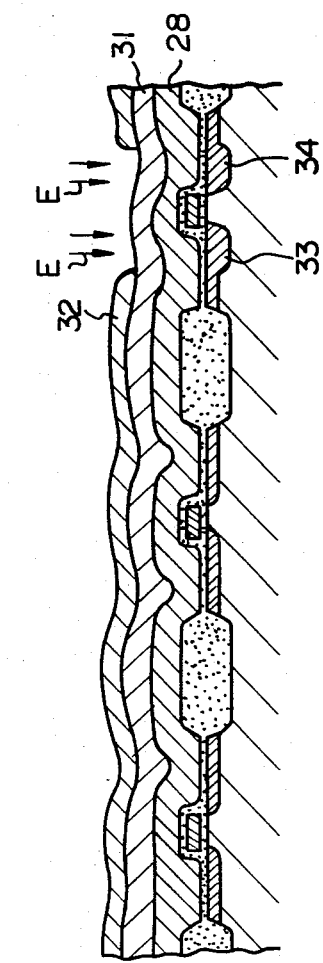
FIG. 6 is a sectional view during the processing of a second embodiment of the manufacture of a semiconductor mask ROM memory device of the present invention.

Next, as shown in FIG. 5B, after a gate oxidation film 23 is formed on the substrate, a photoresist film (not shown) for the pattern formation is formed on the substrate, and boron (B) ions are implanted in the region where the enhancement-type transistor will be formed so as to adjust the threshold voltage of the transistor. Boron (B) is also injected to the region where the punch-through-type transistor will be formed. The photoresist film is then removed. Another photoresist film (not shown) for pattern formation is formed on the substrate, and phosphorus (P) ions are injected into the region where the depletion-type transistor will be formed so as to adjust the surface current (IDSS) of the depletion-type transistor formed thereon. These ion injection processes are well known in the manufacture of conventional enhancement- and depletion-type MIS integration circuits. A polysilicon film is then formed on the substrate by a chemical vapor deposition method so as to form gate electrodes, and a photoresist film is formed over the substrate. The photoresist film is formed in a predetermined pattern by the photoetching method. The polysilicon gate electrodes are formed in a predetermined pattern using the patterned photoresist film as a mask. In FIG. 5C, 24A, 24B, and 24C identify polysilicon gate electrodes formed by the above-mentioned process. Next, the surface of the polysilicon gate electrodes and the regions (the source and drain regions) where the transistor elements will be formed are oxidized. Then, arsenic (As) ions are injected in the regions where the depletion-type transistors, the enhancement-type transistors, or the punch-through type transistors will be formed so as to form the source regions 25A, 25B and 25C and the drain regions 26A, 26B, 26C, as shown in FIG. 5C.

The processing steps of FIG. 5A through FIG. 5C are common processes not involving the desired program information. The process is stopped at this point with the device in an incomplete state, as shown in FIG. 5C, to wait for the desired program. The subsequent program related processing is started when the specific information to be written is decided upon.

Figure 5D:
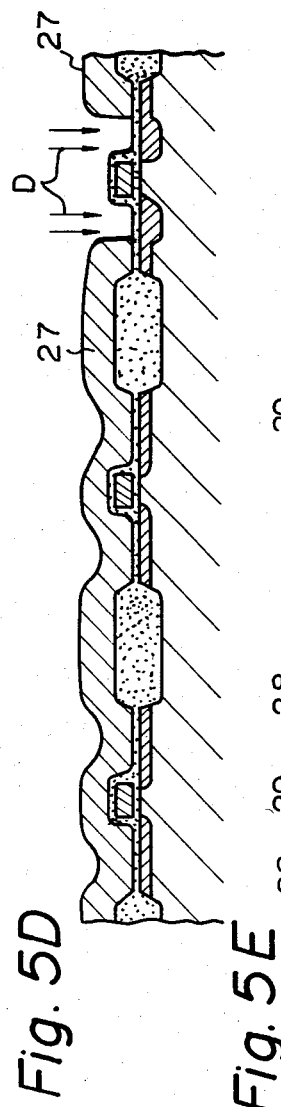
Figure 5E:
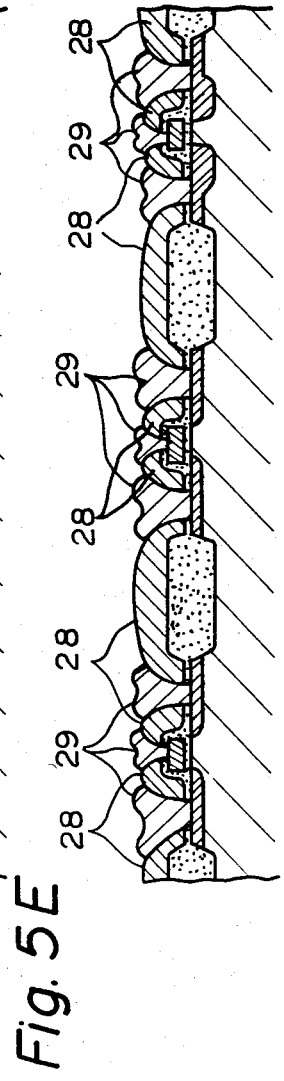

In the program processing steps, the information to be written is used as the basis for the formation of a photoresist film 27, as shown in FIG. 5D, on all regions except regions where source-drains of punch-through-type transistors will be formed. Phosphorus (P) ions, having a larger diffusion coefficient than the impurity arsenic (As) which has already been introduced in the source-drain regions, are injected as shown by the arrow D in FIG. 5D. In the end, this source-drain region is formed to a depth greater than elsewhere for the formation of punch-through-type transistors. Thereafter, the photoresist film 27 is removed; a phosphorus silicate glass (PSG) film 28 is formed as shown in FIG. 5E for an insulation film; and windows are formed for the contact holes for leading out wires from the source regions, drain regions, and gate electrodes. This allows the formation of an aluminum (Al) wiring film 29. After formation, the aluminum film is subjected to a plasma-etching method to produce a wiring pattern of a predetermined pattern.

The above-mentioned removal of the photoresist film 27 should preferably be followed by heat treatment to anneal the injected ions. In this process, heat diffusion of phosphorus (P), which is larger than the diffusion of arsenic (As), helps to ensure the proper formation of the punch-through-type transistors. An excessive degree of diffusion of the phosphorus may cause contact between the source-drain regions, and thus would not result in a punch-through characteristic, but rather in a normally on characteristic. That is, a characteristic where the source and drain are in the on state without application of gate voltage would result. This would not, however, obstruct the performance of the ROM device.

The above-mentioned process allows the output wires $V_{out}$ of each bit line, formed by the series connection of transistors in the element-formation region on the semiconductor substrate, to be formed at the same time as the gate wiring. For example by forming a silicon dioxide film during the above-mentioned manufacturing process, and then removing one portion of the silicon dioxide film from the source region of the load transistors to connect the output wires to the substrate, via a polysilicon layer. The resultant polysilicon connection is the so-called buried contact construction.

In a semiconductor device having the construction of the present invention, when the source-drain regions of the MIS transistors forming the semiconductor memory device are formed, the source regions and the drain regions of certain specified transistors are formed at a greater depth so as to form punch-through-type transistors. Thereafter, well known methods can be followed for the formation of phosphosilicate glass (PSG) film, the formation of the electrode contact windows to the PSG film, the formation of the wiring layer using aluminum (Al), the formation of the surface protective layer, the formation of the bonding pad, etc. This invention thereof, entails fewer processing steps from writing of the information to the completion of the device.

Figure 4B:
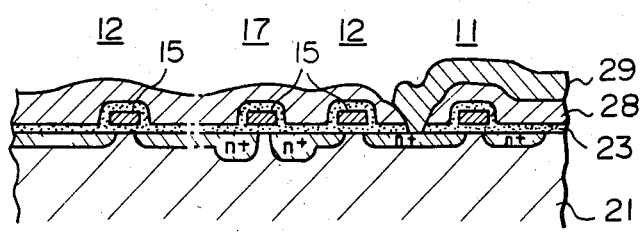

Returning to FIG. 4A and FIG. 4B, FIG. 4B is a cross section of the mask ROM of FIG. 4A along the line X-X' manufactured by the process mentioned above. The area 17' boxed in by the broken line in FIG. 4A corresponds to the window pattern in the photoresist film 27 shown in FIG. 5d. Therefore, the MIS transistor 17 is exposed by the window and formed as a punch-through-type transistor. The other memory cell transistors 12 remain as enhancement-type transistors.

One example of the preferred conditions for carrying out the embodiment of the present invention is as follows. The width of the electrode pattern of the gate polysilicon in the memory cell transistor in 3 microns. The thickness of the gate oxide film is 400 Å. The injection amount of the arsenic (As) ions for forming the source and drain regions is $4 \times 10^{15}$ cm$^{-2}$ injected with an energy of 120 keV. When the thickness of the heat oxide film formed on the surfaces of the polysilicon layer gate and the source and drain regions is 500 Å after the source and drain regions are formed, the injection amount of the phosphorus (P) ions for the programming is $1 \times 10^{16}$ cm$^{-2}$ with an injection energy of 70 keV. The heat treatment carried out after these ions are injected, is carried out at 1050° C. for 20 minutes.

FIG. 6 illustrates another embodiment of the present invention. As shown in FIG. 6, first a PSG film 31 having low phosphorus density and a metal film 32, for example, of aluminum (Al), are formed in accordance with a predetermined pattern. This prepares the device for the following programming process. In the programming process, the portion of the aluminum film 32 corresponding to the source regions and the drain regions of the element regions for the punch-through-type transistors are removed according to the information to be written. Thereafter, a carbonic-acid-gas ($CO_2$) laser beam is directed on the substrate. The section of the laser beam striking the aluminum film 32 is reflected and dispersed; however, the section striking the areas where the aluminum film was removed penetrates to the source region 33 and the drain region 34, which were previously formed by injecting source and drain impurity atoms. The laser beam locally heats the source region and the drain region to diffuse the impurity atoms into the substrate. The diffusion layer in this area is consequently formed to a greater depth, thus producing a punch-through transistor. Also, as noted above, an excessive degree of diffusion of the local impurity results in contact between source and drain regions, and thus an effect different from the punch-through effect is obtained. But, this normally on characteristic would not obstruct the performance of the ROM device. Subsequently, the unnecessary aluminum film is removed.

As explained in detail above, the semiconductor device and manufacturing method of the present invention makes possible a mask-ROM-type semiconductor memory device having a higher density and shorter fabrication process than conventional mask ROM semiconductor memory devices.

Further, the circuit of the device shown in FIG. 3 illustrates only one embodiment for carrying out the present invention. Other embodiments, for example, a circuit for dynamic operation using MIS transistors which receive bit selection signals instead of the load transistor 11, can be carried out without limiting the scope of the present invention.

I claim:

1. A read-only memory semiconductor device comprising:
   a plurality of MIS (metal insulator semiconductor)-type transistors arranged in a matrix, with each of said MIS-type transistors corresponding to one memory information bit and having a source region and a drain region, some of said MIS-type transistors having a normally on characteristic, and the remaining of said MIS-type transistors having a normally off characteristic; and
   at least one of said MIS-type transistors having a normally on characteristic and having a source region and a drain region with a greater depth than the depth of the source region and the drain region of said MIS transistors having a normally off characteristic.

2. A read-only memory semiconductor device according to claim 1, wherein said MIS-type transistors having a normally on characteristic are punch-through transistors.

3. A read-only memory semiconductor according to claim 1, wherein the source region and the drain region of said MIS-type transistors having a normally on characteristic are connected with each other.

4. A read-only memory device operatively connectable to receive a high and a low power source voltage, comprising:
   a substrate;
   MIS (metal insulator semiconductor)-type transistors arranged in a matrix, each having a source impurity region, a drain impurity region, and a gate, said MIS-type transistors being arranged such that adjacent transistors of said MIS-type transistors arranged in the columns of said matrix are operatively connected in series between said high and low power source voltage, and adjacent transistors of said MIS-type transistors arranged in the rows of said matrix having said gates operatively connected in common;
   selected ones of said MIS-type transistors being normally on and the remaining of said MIS-type transistors being normally off;
   selected ones of said normally on MIS-type transistors having source and drain regions with a depth greater than the depth of said source and drain regions of said remaining MIS transistors having normally off characteristic.

5. A read-only memory semiconductor according to claim 4, further comprising load transistors, respectively, operatively connected between said series connected MIS-type transistors and said high power source voltage, each load transistor having a gate electrode operatively connected in common.

* * * * *

UNITED STATES PATENT AND TRADEMARK OFFICE
CERTIFICATE OF CORRECTION

PATENT NO. : 4,500,975

DATED : February 19, 1985

INVENTOR(S) : Shirato

It is certified that error appears in the above-identified patent and that said Letters Patent is hereby corrected as shown below:

```
Column 2, line 8, "of" should be --or--.
Column 4, line 2, after "1" insert --,--.
Column 6, line 29, "(Al)" should be --(Aℓ)--;
          line 67, "(Al)" should be --(Aℓ)--.
Column 7, line 1, "thereof," should be --therefore,--;
          line 15, "in" (second occurrence) should be --is--;
          line 31, "(Al)" should be --(Aℓ)--.
```

Signed and Sealed this

Thirtieth Day of July 1985

[SEAL]

Attest:

DONALD J. QUIGG

*Attesting Officer*  *Acting Commissioner of Patents and Trademarks*